United States Patent
Reiter et al.

(10) Patent No.: US 10,290,465 B2
(45) Date of Patent: May 14, 2019

(54) METHOD FOR DETERMINING THE CHANGING LOCATION OF THE POINT OF INCIDENCE OF AN ENERGETIC BEAM ON A DELIMITED SURFACE

(71) Applicant: ALD Vacuum Technologies GmbH, Hanau (DE)

(72) Inventors: Georg Reiter, Freigericht (DE); Matthias Waelzlein, Hasselroth (DE)

(73) Assignee: ALD Vacuum Technologies GmbH, Hanau (DE)

( * ) Notice: Subject to any disclaimer, the term of this patent is extended or adjusted under 35 U.S.C. 154(b) by 0 days.

(21) Appl. No.: 15/768,486

(22) PCT Filed: Oct. 13, 2016

(86) PCT No.: PCT/DE2016/100478
§ 371 (c)(1),
(2) Date: Apr. 13, 2018

(87) PCT Pub. No.: WO2017/063642
PCT Pub. Date: Apr. 20, 2017

(65) Prior Publication Data
US 2018/0308660 A1 Oct. 25, 2018

(30) Foreign Application Priority Data
Oct. 16, 2015 (DE) .................. 10 2015 117 693

(51) Int. Cl.
*H01J 37/305* (2006.01)
*H01J 37/30* (2006.01)

(52) U.S. Cl.
CPC ...... *H01J 37/3053* (2013.01); *H01J 37/3005* (2013.01); *H01J 2237/2482* (2013.01);
(Continued)

(58) Field of Classification Search
USPC .......................................... 250/307
See application file for complete search history.

(56) References Cited

U.S. PATENT DOCUMENTS 6,172,363 B1 * 1/2001 Shinada .............. G01R 31/305
  250/307
6,576,902 B2 * 6/2003 Kuwahara ............ G01N 23/04
  250/306
(Continued)

FOREIGN PATENT DOCUMENTS

DE 44 44 538 A1 6/1996
DE 10 2008 009 410 B4 9/2009
(Continued)

OTHER PUBLICATIONS

PCT/DE2016/100478, International Search Report dated Feb. 21, 2017 (Two (2) pages).

*Primary Examiner* — Phillip A Johnston
(74) *Attorney, Agent, or Firm* — Crowell & Moring LLP

(57) ABSTRACT

In order to evaporate material, an electronic beam is guided over a melt surface in a periodic pattern by a detecting unit. Whether or not the actual pattern matches the target pattern specified by the deflecting unit is detected in principle on an image of the melt surface. In order to allow a better analysis of the image, the periodicity of the deflection pattern during the analysis of temporally successive images is taken into consideration.

9 Claims, 1 Drawing Sheet

(52) U.S. Cl.
CPC ........... *H01J 2237/30455* (2013.01); *H01J 2237/30472* (2013.01); *H01J 2237/3132* (2013.01)

(56) References Cited

U.S. PATENT DOCUMENTS

| | | | |
|---|---|---|---|
| 8,937,283 B2* | 1/2015 | Hatakeyama | H01J 37/244 250/310 |
| 2005/0205778 A1* | 9/2005 | Kitai | B23K 26/032 250/309 |

FOREIGN PATENT DOCUMENTS

| | | |
|---|---|---|
| DE | 10 2009 013 310 A1 | 9/2009 |
| DE | 10 2010 003 661 A1 | 11/2011 |
| DE | 10 2013 107 454 A1 | 1/2015 |
| DE | 10 2013 113 110 A1 | 5/2016 |
| WO | WO 2009/100877 A1 | 8/2009 |

* cited by examiner

METHOD FOR DETERMINING THE CHANGING LOCATION OF THE POINT OF INCIDENCE OF AN ENERGETIC BEAM ON A DELIMITED SURFACE

CROSS REFERENCE TO RELATED APPLICATIONS

This application claims the priority of International Application No, PCT/DE2016/100478, filed Oct. 13, 2016, and German Patent Application No. 10 2015 117 693.9 filed Oct. 16, 2015, the entire disclosures of which are herein expressly incorporated by reference.

BACKGROUND AND SUMMARY OF THE INVENTION

The invention relates to a method for determining the changing location of the point incidence of a continuous or pulsed energetic beam on a delimited surface, which is moved periodically over the surface by a deflecting unit, wherein the surface is detected with a camera having a plurality of individually evaluable pixels in an image plane, wherein each point of the surface is associated with a pixel and wherein the image values detected by the camera are evaluated by means of an image analysis device.

US 2005/205778 describes a system for calibrating the deflection of a laser beam to remove material from electronic components in order to modify their properties. A test card with a defined pattern is used to detect imaging errors, which allows the detected imaging errors to be compensated for.

The energetic beam may be, for example, an electron beam generated by an electron gun, which is directed at the melt surface to evaporate material there, which serves for the coating of components. Other uses of energetic beams are discussed below. In order to obtain a uniform energy input into the surface, a deflecting unit is provided which moves the energetic beam periodically in a predetermined pattern over the surface. The beam can be operated continuously or pulsed, wherein a new point of incidence is defined for each pulse, so that a periodically recurring pattern of points of incidence results.

Since the position of the surface to be detected with respect to the electron beam gun is known, the deflecting unit can be adjusted so that the pattern covers the entire delimited surface.

However, it has become apparent that deviations from the set target pattern result due to external influences. Since the effects of the influences on the beam are not necessarily reproducible, they cannot be considered in advance in a corresponding control function for the deflection. Therefore, it is necessary to provide the operator of a corresponding apparatus with an image of the surface on which the migrating point of incidence can be seen, or the pattern that arises. If the operator recognizes that the path of the point of incidence deviates from the desired path or the pattern deviates from the set target pattern, he/she can readjust the deflecting unit accordingly.

DE 10 2008 009 410 B4 already discloses the automation of this process. For this purpose, an analysis is made of the image of the surface scanned by the beam and, with the aid of image analysis, the path of the point of incidence is compared with the desired path, if deviations occur, a corresponding automatic readjustment of the deflecting unit takes place.

Such automatic image analysis is difficult, however, because, for example, the melt surface is very bright, so that the point of incidence, although it should have a higher brightness than its surroundings due to a corresponding energy input, is difficult to see because its brightness differs only slightly from the brightness of the background.

The prior art also includes DE 10 2013 107 454 A1, which also deals with delimiting the movement of an electron beam over a surface on a certain area, e.g., a melt surface. For this purpose, a sensor is used, which registers the reactions of the incidences of the electron beam on the scanned surface. These reactions can be electromagnetic radiation or secondary electrons. However, the sensor is not a camera having a plurality of pixels each associated with surface points. The sensor does not record the electromagnetic radiation or the secondary electrons rasterized into pixels, but as a single value, which averages the reaction over the entire scanned surface.

It should also be taken into account that processes in which energetic, in particular high-energy beams, scan a surface take place in an encapsulated device. However, a camera for image analysis is placed outside the device and receives the image of the surface through a transparent disk, which reduces the image intensity in an unpredictable manner due to deposits of vapors that arise when scanning the surface, so that brightness differences in the image can no longer be assigned with certainty to a point of incidence.

In this context, when talking about a camera, it can, in principle, be a camera that picks up light in the visible wavelength range, infrared or some other frequency range. What is also meant are image acquisition systems that are based on other physical principles, as explained in more detail below. However, what is decisive is that the surface is imaged onto an image plane in the image acquisition system and that the image plane pixels are detected individually, so that they can be evaluated individually.

Preferably, however, the camera is a CCD camera with two-dimensional CCD array sensors, each individual CCD sensor of the arrays representing one pixel.

While a trained operator of a corresponding apparatus will still be able to determine the path of the point of incidence even in a poor image and manually make corresponding corrections on the deflecting unit, it is necessary—in particular for an automatic control—to perform especially reliable image recognition, in which the path of the point of incidence and the pattern thus generated can be reliably identified.

The invention is therefore based on the task of creating an image analysis in which the path of the point of incidence of an energetic beam on a delimited surface can be reliably identified.

For this purpose, the invention provides that:

the image analysis device determines a temporal sequence of image values for at least some of the pixels, a signal analysis of the temporal sequence of image values of these pixels is made, the results of the signal analysis are correlated with the periodicity induced by the deflecting unit and/or the periodicity of the beam pulse, and, based on the quality of the correlation, it is determined whether the point of the surface associated with the respective pixel has been hit by the energetic beam at a particular time.

Since the continuous or pulsed beam is moved periodically by the control unit over the delimited surface, this periodicity is also found in the temporal sequence of image values for a pixel. This means that for each pixel a specific image value variation results, which is determined by the periodically recurring incidence of the beam on the surface point. If one now considers the temporal sequence of the image values for a pixel, one can determine its frequency spectrum and filter out the period frequency. In this way, individual bright image values, which are, however, caused by other than the incidence of the beam, are suppressed in the analysis.

It can therefore be determined by suitable mathematical methods whether the sequence of image values is characteristic for the incidence of the beam, so that, when an analysis is carried out for corresponding further pixels, a temporal course of the migration of the point of incidence on the surface can be determined. This can be done both for continuous beams and for pulsed beams, wherein in the latter case the pulse frequency can be included in the frequency analysis of the temporal sequence of image values.

Preferably, the continuous or pulsed beam is moved over the surface by a deflecting unit in a pattern that repeats periodically at a base frequency. In such a case, this base frequency can be used for the analysis of the sequence of image values.

For this purpose, for example, a spectrum of the temporal sequence can be determined, then the repetition frequency of the pattern filtered out and transformed back into a temporal sequence.

In addition to the base frequency, which describes the repetition of the pattern, there are other frequencies in the image, namely the oscillation frequencies which result from the frequency spectra with which the beam is deflected in the two planar directions, which are usually perpendicular to one another. These frequency spectra can also be used to analyze the sequence of image values.

The invention therefore provides that the beam is deflected by a deflecting unit for each of the two planar directions with a respectively specific frequency spectrum, the results of the signal analysis being correlated with the specific frequency spectra.

Another frequency, which can be used to analyze the sequence of image values, when using a pulsed beam, is its pulse rate.

As mentioned above, the beam is typically an electron beam used to re-melt or vaporize material. In this respect, the delimited surface is the surface of a melt.

However, observations of X-ray, laser or particle beams would also be conceivable. Laser beams are, for example, also used in 3D printers. Again, there are at least partially periodically recurring patterns on straight or curved surfaces, so that the invention is also suitable for controlling a three-dimensional print.

As mentioned above, with the incidence of the beam, certain physical processes are induced on the material forming the surface. Thus, in a melt, in addition to visible light, X-rays and particle beams which emanate from the point of incidence are generated. These can also be used to display an image using a corresponding image acquisition system.

As mentioned above, the method does not serve only to display an image on which the path of the point of incidence over the surface is visible, thus allowing an operator to make appropriate adjustments to a deflecting unit. Rather, the method can also be supplemented so that the information obtained on the path of the energetic beam over the surface flows into the control of the deflecting unit as a control variable.

Since, as explained, the prescribed method for image recognition permits reliable identification of the path of the deflection beam, a corresponding control algorithm for controlling the deflecting unit, which does not lead to a maladjustment, can also be set up.

An apparatus for carrying out the method preferably consists of a crucible for receiving a melt, an electron beam gun, which is directed onto the crucible, a deflecting unit controllable by means of a control device which moves the electron beam of the electron beam gun periodically over the melt surface, a camera, which is directed into the crucible and has a plurality of individually evaluable pixels in an image plane, each point of the surface being assigned a pixel, and with an image analysis device, characterized in that the image analysis device is arranged so that the periodicity of the beam deflection is used for image analysis to identify the points of incidence in the image.

The device may be supplemented in the sense that the image analysis device is adapted to output a correction value to the control of the deflecting unit.

In the following, the invention will be explained in more detail with reference to an embodiment.

DETAILED DESCRIPTION OF THE DRAWINGS

Figure 1:
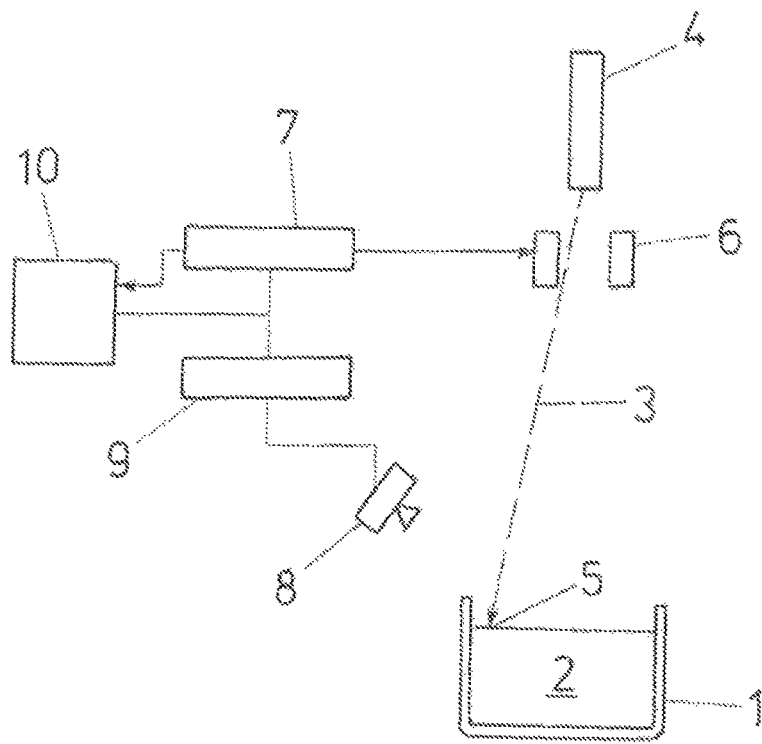
FIG. 1 is a schematic representation of a device with an electron beam gun.

Referring to FIG. 1, it can be seen that a melt 2 is located in a crucible 1, on the surface of which the electron beam 3 of an electron gun 4 is directed. The beam 3 melts the material or evaporates the melt 2 in the region of its point of incidence 5. The evaporated material impinges e.g., on a body to be coated—not shown here—which may be, for example, a turbine blade.

In order not to focus the energy input on a particular position of the melt surface, the beam 3 is moved in a repeating pattern over the entire melt surface 2 delimited by the crucible wall. For this purpose, the beam 3 is periodically moved over the surface by a deflecting unit 6, which consists of perpendicular electromagnets, in whose fields the electrons are deflected.

The deflecting unit 6 provides a separate deflecting unit for both surface directions, whose electromagnets are powered by a control unit 7. The strength of the respective electric current determines the deflection of the electron beam 3 in the X and Y directions. The currents for the X and Y directions are each subject to a specific periodicity and phase position, so that different patterns can be generated on the surface.

Spiral patterns are conceivable, as are jump-line patterns. In any case, the pattern will repeat after some time. This repetition is described with a base frequency. The parameters for the temporal sequence of the deflection currents in the X and Y directions are initially set manually.

Furthermore, there is a camera 8, which images the melt surface 2. With some experience, the respective point of incidence 5 of the electron beam 3 can be recognized on the camera image and its path over the melt surface, so that an experienced operator can recognize whether the pattern drawn by the path covers the surface uniformly and corresponds to the set target pattern.

Since the melt surface as a whole has a high brightness, the identification of the point of incidence and its path on the melt surface is not easy. Therefore, the invention provides an image analysis method in which the temporally successive images are examined and analyzed for periodicity, which is determined by the setting of the deflecting unit. For this purpose, the camera image is supplied to an image analysis device 9, in which the claimed method is implemented. The image taken by the camera can also be displayed on a monitor 10.

Figure 2:
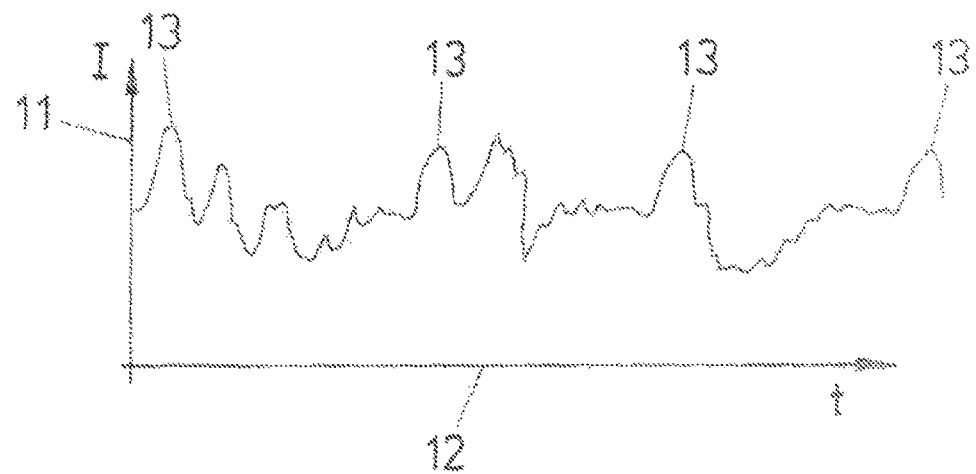
FIG. 2 shows the temporal sequence of the image values in a pixel when the scanning of the surface takes place in a periodically repeating pattern.

If one looks at, for example, an image that belongs to a certain surface point, and, as shown in the diagram of FIG. 2, if the corresponding image value (Y-axis 11), i.e., its light intensity over time (X-axis 12), is displayed, a specific image value 13 or an image value variation and the respectively temporally adjacent values in the base frequency are thus repeated. Since the base frequency is known, the intensity of light can be unambiguously attributed to the electron beam at a certain point in time by suitable mathematical methods and thus the specific image value 13 or the image value variation can be identified.

Corresponding analyses can also be performed on the basis of the oscillation frequencies or the pulse frequency.

Furthermore, temporal series of images can be examined. The migration of the point of incidence on the melt surface must follow the periodicity of the deflection in the different surface directions or contain a pulse spectrum, so that the examination of a temporal series of images taking into account the frequency spectrum of the deflection for the two planar directions allows conclusions to be drawn regarding which detected light intensities are actually due to the incidence of a light beam.

The analysis can be summarized in a representation that reflects the pattern drawn from the path of the point of incidence as a whole, wherein the overall brightness of the surface is suppressed. Such a representation is also presented to the operator on the monitor 10. This sort of schematic representation allows better manual re-adjustment of the deflecting unit 6.

However, the analysis can also be transformed into suitable parameters which are supplied to the control unit 7 so that it automatically adjusts the control variables such as amplitude, frequency and phase of the currents for the deflecting units, so that the actual pattern is matched with the target pattern. Thus a control loop is created.

LIST OF REFERENCE SYMBOLS

1 Crucible
2 Melt
3 Electron beam
4 Electron gun
5 Point of incidence
6 Deflecting unit
7 Control unit
8 Camera
9 Image analysis device
10 Monitor
11 Y-axis
12 X-axis
13 Specific image value

The invention claimed is:

1. A method for determining a changing location of a point of incidence of a continuous or pulsed energy beam on a surface that is periodically moved over the surface by a deflecting unit, comprising the steps of:
    detecting the surface with a camera having a plurality of individually evaluable pixels in an image plane, wherein each point of the surface is associated with a respective pixel;
    evaluating image values detected by the camera by an image analysis device;
    determining a temporal sequence of the image values for at least some of the pixels by the image analysis device;
    making a signal analysis of the temporal sequence;
    correlating results of the signal analysis with a periodicity induced by the deflecting unit and/or a periodicity of the energy beam; and
    based on a quality of the correlating, determining whether the point of the surface associated with the respective pixel has been hit by the energy beam at a particular time.

2. The method according to claim 1, wherein the energy beam is moved over the surface by the deflecting unit in a pattern that repeats periodically at a base frequency and wherein the results of the signal analysis are correlated with a periodicity induced by the base frequency.

3. The method according to claim 1, wherein the energy beam is deflected by the deflecting unit for each of two planar directions with a respective frequency spectrum and wherein the results of the signal analysis are correlated with the respective frequency spectrums.

4. The method according to claim 1, wherein the energy beam is an electron beam.

5. The method according to claim 1, wherein the surface is a surface of a melt or a material to be melted.

6. The method according to claim 1, wherein the image values represent an intensity of an outgoing electromagnetic radiation from the point of incidence or an outgoing point particle beam from the point of incidence.

7. The method according to claim 1, wherein information obtained on a path of the energy beam over the surface flows into a control of the deflecting unit as a control variable.

8. An apparatus for carrying out the method according to claim 1, comprising:
    a crucible;
    an electron beam gun which is directed onto the crucible;
    a deflecting unit controllable by a control device which moves a beam of electrons from the electron beam gun periodically over a melt surface disposed in the crucible;
    a camera which is directed into the crucible and has a plurality of individually evaluable pixels in an image plane, wherein each point of the melt surface is associated with a respective pixel; and
    an image analysis device, wherein the image analysis device uses a periodicity of beam deflection and/or beam pulse for image analysis to identify points of incidence of the beam on the surface in an image of the melt surface from the camera.

9. The apparatus according to claim 8, wherein the image analysis device is configured to output a correction value to a control of the deflecting unit.

* * * * *